(12) United States Patent
Han et al.

(10) Patent No.: US 9,741,820 B2
(45) Date of Patent: Aug. 22, 2017

(54) PMOS TRANSISTOR AND FABRICATION METHOD THEREOF

(71) Applicant: Semiconductor Manufacturing International (Shanghai) Corporation, Shanghai (CN)

(72) Inventors: Qiuhua Han, Shanghai (CN); Lihong Xiao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/170,700

(22) Filed: Jun. 1, 2016

(65) Prior Publication Data

US 2016/0351686 A1 Dec. 1, 2016

(30) Foreign Application Priority Data

Jun. 1, 2015 (CN) .......................... 2015 1 0292726

(51) Int. Cl.
| | | |
|---|---|---|
| *H01L 29/66* | (2006.01) | |
| *H01L 21/02* | (2006.01) | |
| *H01L 29/78* | (2006.01) | |
| *H01L 21/311* | (2006.01) | |
| *H01L 21/768* | (2006.01) | |

(52) U.S. Cl.
CPC ...... *H01L 29/66545* (2013.01); *H01L 21/022* (2013.01); *H01L 21/0214* (2013.01);
(Continued)

(58) Field of Classification Search
CPC ............... H01L 29/66545; H01L 29/78; H01L 21/02348; H01L 21/0214; H01L 21/0217; H01L 21/02126; H01L 21/28518; H01L 21/02274
See application file for complete search history.

(56) References Cited

U.S. PATENT DOCUMENTS 6,534,354 B1 * 3/2003 Lee ..................... H01L 21/265
257/E21.334
6,720,213 B1 * 4/2004 Gambino .......... H01L 21/31155
257/E21.248
(Continued)

OTHER PUBLICATIONS

Cacace et al, "Experimental detection of tetranitrogen", Science Jan. 18, 2002: vol. 295, Issue 5554, pp. 480-481.*
(Continued)

*Primary Examiner* — Vincent Wall
(74) *Attorney, Agent, or Firm* — Anova Law Group, PLLC

(57) ABSTRACT

The disclosed subject matter provides a p-channel metal-oxide-semiconductor (PMOS) and fabrication method thereof. The PMOS transistor is fabricated by a method including forming a dummy gate structure on a semiconductor substrate, forming a source region and a drain region in the semiconductor substrate on both sides of the dummy gate structure, forming an intermediate layer to cover the dummy gate structure and the semiconductor substrate, and forming a multiple-level etching stop layer including at least a first etching stop layer and a second etching stop layer. The fabrication method also includes performing a UV curing process after forming each of the first and second etching stop layers.

17 Claims, 6 Drawing Sheets

(52) U.S. Cl.
CPC .... *H01L 21/0217* (2013.01); *H01L 21/02274* (2013.01); *H01L 21/02348* (2013.01); *H01L 21/31116* (2013.01); *H01L 21/76825* (2013.01); *H01L 21/76832* (2013.01); *H01L 21/76834* (2013.01); *H01L 29/78* (2013.01)

(56) References Cited

U.S. PATENT DOCUMENTS

| | | | | |
|---|---|---|---|---|
| 6,797,646 | B2* | 9/2004 | Ngai | C23C 16/401 |
| | | | | 257/E21.247 |
| 7,678,688 | B2* | 3/2010 | Choi | H01L 21/76801 |
| | | | | 257/E21.482 |
| 8,299,508 | B2* | 10/2012 | Hsieh | H01L 29/6656 |
| | | | | 257/288 |
| 2008/0020591 | A1* | 1/2008 | Balseanu | C23C 16/345 |
| | | | | 438/761 |
| 2009/0022908 | A1* | 1/2009 | Yang | C23C 16/24 |
| | | | | 427/579 |
| 2009/0203176 | A1* | 8/2009 | Kakehata | H01L 21/76254 |
| | | | | 438/164 |
| 2014/0252431 | A1* | 9/2014 | Lee | H01L 29/785 |
| | | | | 257/288 |

OTHER PUBLICATIONS

Prof. Saraswat, "EE311 notes: Interconnections: Silicides", Apr. 28, 2004, pp. 1-27.*

* cited by examiner

PMOS TRANSISTOR AND FABRICATION METHOD THEREOF

CROSS-REFERENCES TO RELATED APPLICATIONS

This application claims the priority of Chinese Patent Application No. CN201510292726.1, filed on Jun. 1, 2015, the entire content of which is incorporated herein by reference.

FIELD OF THE DISCLOSURE

The present disclosure generally relates to the field of semiconductor fabrication technology and, more particularly, relates to a p-channel metal-oxide-semiconductor (PMOS) transistor and fabrication method thereof.

BACKGROUND

MOS (metal-oxide-semiconductor) transistor is one of the most important components in modern integrated circuits (ICs). The basic structure of a MOS transistor includes: a semiconductor substrate, a gate structure, a source region formed on one side of the gate structure, and a drain region formed on another side of the gate structure. In addition, the gate structure may further include a dielectric layer formed on the surface of the semiconductor substrate and a gate electrode formed on the surface of the dielectric layer.

According to existing fabrication methods for MOS transistors, at the beginning of the fabrication process, a dielectric layer is usually formed on a semiconductor substrate. A gate electrode layer may then be formed on the dielectric layer. Further, a gate structure may be formed by etching the dielectric layer and the gate electrode layer. Finally, a source region and a drain region may be formed respectively in the semiconductor substrate on the two opposite sides of the gate structure. The dielectric layer in such a MOS transistor is usually made of an oxide material such as $SiO_2$.

With continuous increase of the integration degree of MOS transistors, the voltage and the current required for operating MOS transistors steadily decrease and the switching speed of the transistors also increases. As a consequence, substantial improvement on the semiconductor technology may be required. To this end, in the semiconductor industry, a method of using a high-k material to replace $SiO_2$ for the fabrication of the dielectric layer has been developed in order to provide better isolation between the gate structure and other components of a MOS transistor and reduce current leakage. In the meantime, a metal material is also adopted to replace the traditionally used polycrystalline silicon for fabricating the gate electrode layer in order to be compatible with the high-k (k is greater than 3.9) material. For MOS transistors fabricated with a high-k dielectric layer and a metal gate layer, the leakage current may be further reduced and the gate driving capability may also be effectively improved.

However, a large number of interface states may exist at the interface between the high-k dielectric layer and the semiconductor substrate. During the fabrication process of the MOS transistor, such interface states may form unstable chemical bonds with hydrogen, thus may further affect the performance of the MOS transistor. In particular, severe negative bias temperature instability (NBTI) effect may exist in p-channel MOS (PMOS) transistors. Therefore, the performance and the reliability of PMOS transistors formed by existing methods may be poor.

The disclosed fabrication method and device structure in the present disclosure are directed to solve one or more problems set forth above and other problems in the art.

BRIEF SUMMARY OF THE DISCLOSURE

One aspect of the present disclosure includes a method for fabricating a PMOS transistor. The method includes forming a dummy gate structure on a semiconductor substrate, forming a source region and a drain region in the semiconductor substrate on both sides of the dummy gate structure, forming an intermediate layer to cover the dummy gate structure and the semiconductor substrate, and forming a multiple-level etching stop layer including at least a first etching stop layer and a second etching stop layer and performing a UV curing process after forming each of the first and second etching stop layers.

Another aspect of the present disclosure provides a PMOS transistor. The PMOS transistor includes a semiconductor substrate, a metal gate structure formed on the semiconductor substrate, a source region and a drain region formed in the semiconductor substrate on both sides of the metal gate structure, an intermediate layer covering sidewall surfaces of the metal gate structure and the semiconductor substrate, and a multiple-level etching stop layer formed on the intermediate layer. The multiple-level etching stop layer further includes at least a first UV-cured etching stop layer and a second UV-cured etching stop layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

FIGS. 1-5 illustrate schematic cross-section views of semiconductor structures corresponding to certain stages of an existing fabrication method for a PMOS transistor.

Figure 1:
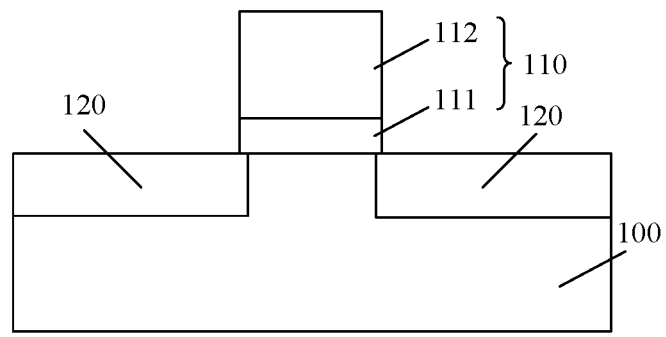
FIGS. 1-5 illustrate schematic cross-section views of semiconductor structures corresponding to certain stages of an existing fabrication method for a PMOS transistor.

Referring to FIG. 1, a semiconductor substrate 100 is provided at the beginning of the fabrication process. A dummy gate structure 110 may be formed on the surface of the semiconductor substrate 100.

The dummy gate structure 110 may include a high-k dielectric layer 111 formed on the surface of the semiconductor substrate 100 and a polycrystalline silicon layer 112 formed on the surface of the high-k dielectric layer 111. The semiconductor substrate 100 may be made of silicon. The semiconductor structure may also include sidewalls (not shown) formed on both sides of the dummy gate structure 110.

Further, a source region 120 may be formed in the semiconductor substrate 100 on one side of the gate structure 110 while a drain region 120 may be formed in the semiconductor substrate 100 on the other side of the gate structure 110.

Figure 2:
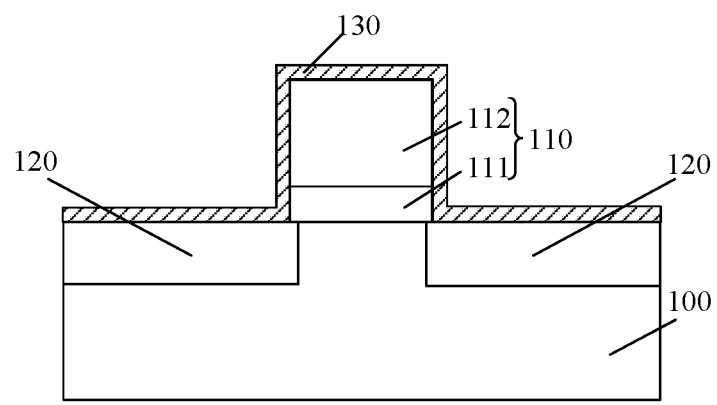

Referring to FIG. 2, an etching stop layer 130 may then be formed to cover the dummy gate structure 110 and the semiconductor substrate 100.

The etching stop layer 130 may be made of SiN$_x$. In a subsequent process, a contact opening may be formed by etching an interlayer dielectric layer formed on the surface of the semiconductor substrate 100. During the subsequent etching process, the ratio of the etching rate on the etching stop layer 130 to the etching rate on the interlayer dielectric layer formed on the surface of the semiconductor substrate 100 is small so that the etching stop layer 130 may prevent over etching, thus may protect the surface of the PMOS transistor structure under the etching stop layer 130.

The etching stop layer 130 may be formed by a plasma chemical vapor deposition (PCVD) process.

Figure 3:
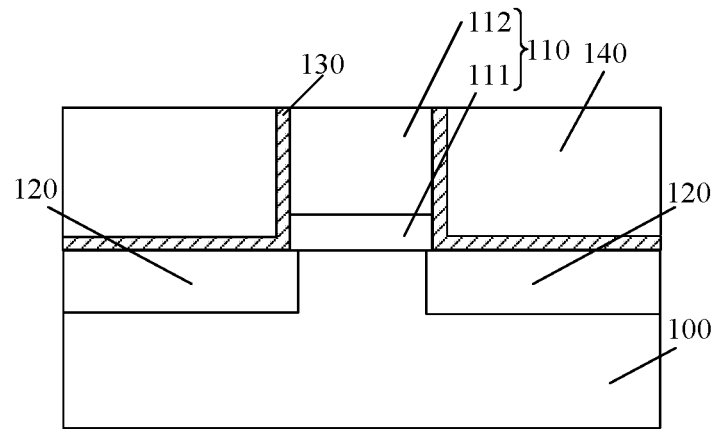

Further, referring to FIG. 3, an interlayer dielectric layer 140 may be formed on the top of the semiconductor substrate 100 on both sides of the dummy gate structure 110.

The interlayer dielectric layer 140 may be formed by a process including the following steps. First, an interlayer dielectric material layer may be formed on the top of the semiconductor substrate 100 and the dummy gate structure 110. Then, a planarization process may be performed on the formed interlayer dielectric material layer until the top surface of the dummy gate structure 110 is exposed.

Figure 4:
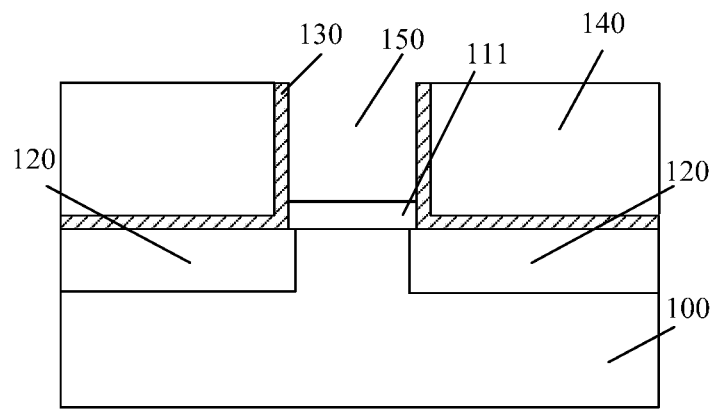

Referring to FIG. 4, a trench 150 may be formed by removing the polycrystalline silicon layer 112 in the dummy gate structure 110.

Figure 5:
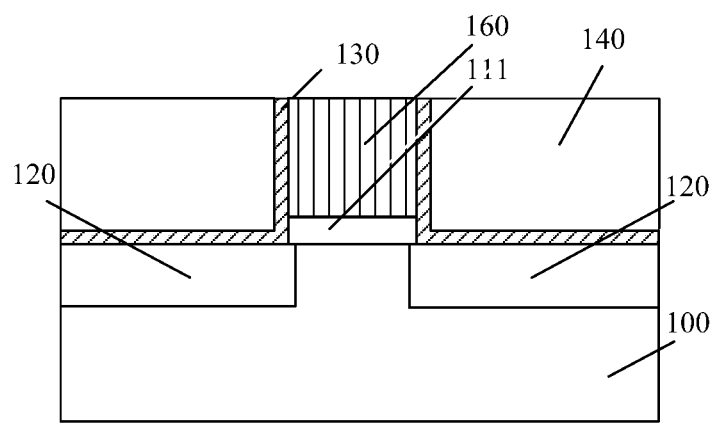

Finally, referring to FIG. 5, a metal gate electrode 160 may then be formed by filling up the trench 150.

However, the performance of the PMOS formed by the method described above may still be poor. The reason for the poor performance of the PMOS may lie in several aspects.

A large number of interface states may exist at the interface between the high-k dielectric layer and the semiconductor substrate. Such interface states may form unstable chemical bonds with hydrogen during the fabrication process of the PMOS transistor, thus performance of the PMOS transistor may be affected. Further, negative bias temperature instability (NBTI) effect may be severe in the formed PMOS transistor. The NBTI effect is a phenomenon referring to degradation of a series of electrical parameters of a PMOS transistor due to high temperature, strong field, and negative gate voltage. Such degradation may include increase in gate current, negative drift of threshold voltage, decrease in subthreshold slope, etc.

The emergence of the NBTI effect is primarily due to the release of hydrogen gas at the interface between the semiconductor substrate and the high-k dielectric layer when the PMOS transistor is at a high temperature and with a negative gate voltage applied. Specifically, holes in an inversion layer of the PMOS transistor may be excited and may then tunnel to the interface between the semiconductor substrate and the high-k dielectric layer. Further, since a large number of Si—H bonds may exist at the interface, thermally excited holes may interact with the Si—H bonds and produce hydrogen atoms, leaving dangling bonds at the interface. Because hydrogen atoms are not stable, two hydrogen atoms may combine with each other to form hydrogen gas. Further, hydrogen gas may then be released, leading to a negative drift of the threshold voltage.

According to the fabrication method described above, during the deposition of the etching stop layer, a large number of reactive molecules, atoms, and ions in either the ground states or the excited states may exist in the deposition vapor, leading to a complex reaction process. Further, the ratio of silicon atoms to nitrogen atoms in the etching stop layer may vary as the deposition condition changes. Therefore, the ratio of silicon atoms to nitrogen atoms in the etching stop layer may deviate from the normal stoichiometric ratio. Moreover, in addition to having Si—N bonds, the etching stop layer may also have a large number of Si—H bonds, N—H bonds, and silicon dangling bonds. Thus, the etching stop layer may contain a lot of hydrogen atoms. In addition, water vapor in the environment may also increase the hydrogen content in the etching stop layer.

Further, hydrogen atoms in the etching stop layer may diffuse to the interface between silicon and the high-k dielectric layer, leading to formation of more unstable Si—H bonds at the interface. Therefore, the NBTI effect in PMOS transistor may become more severe.

The thickness of the etching stop layer may be reduced in order to reduce the hydrogen content in the etching stop layer. As a consequence, the NBTI effect in the PMOS transistor may also be reduced. However, reducing the thickness of the etching stop layer may also reduce the stress induced in the channel area by the etching stop layer, which may further affect the performance of the PMOS transistor.

Figure 15:
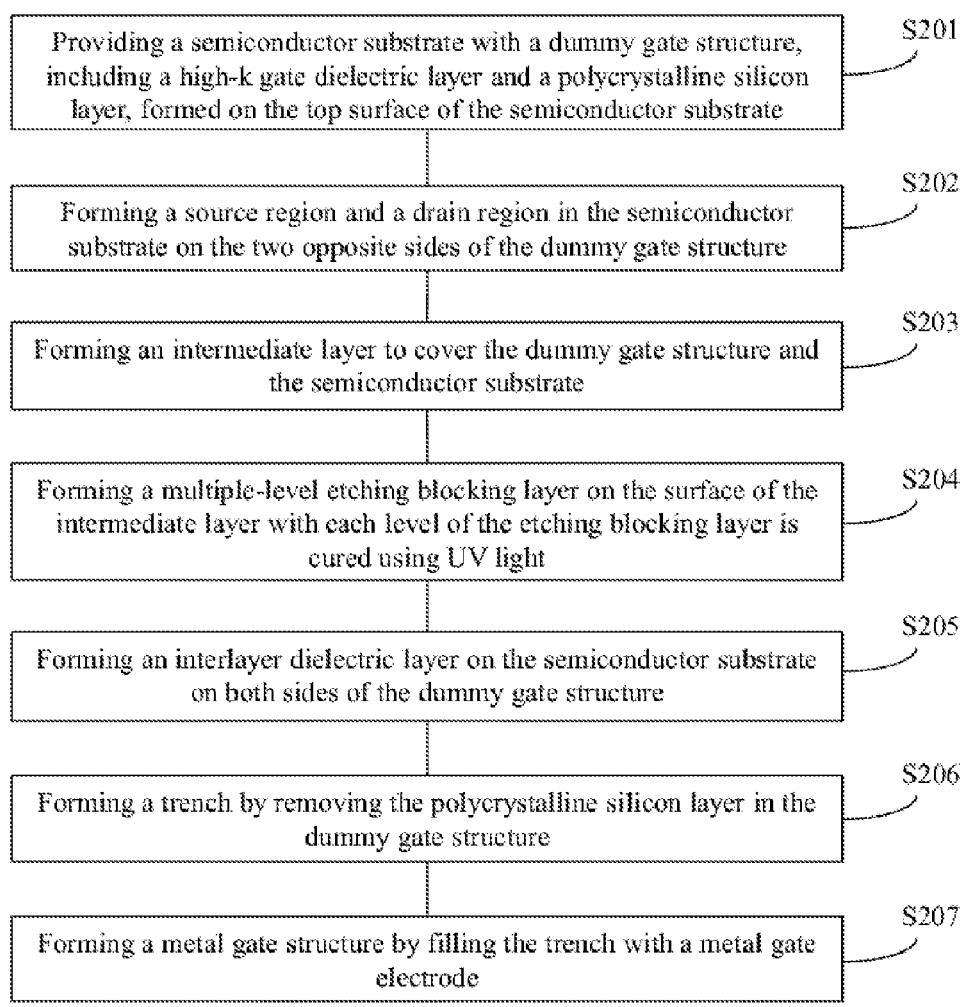
FIG. 15 illustrates a flowchart of an exemplary fabrication process for a PMOS transistor consistent with disclosed embodiments.

The present disclosure provides PMOS transistors and fabrication methods for PMOS transistors to reduce the NBTI effect in the PMOS transistors. FIG. 15 shows a flowchart of an exemplary fabrication process for a PMOS transistor consistent with disclosed embodiments.

Figure 6:
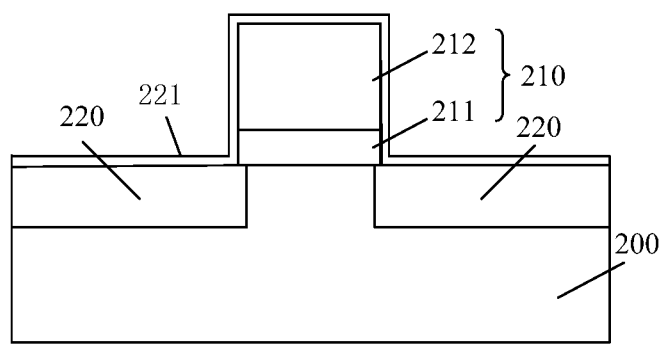
FIGS. 6-14 illustrate schematic views of semiconductor structures corresponding to certain stages of an exemplary fabrication method for a PMOS transistor consistent with disclosed embodiments.

Referring to FIG. 15, at the beginning of the fabrication, a semiconductor substrate is provided (S201). FIG. 6 shows a schematic cross-section view of a semiconductor structure consistent with disclosed embodiments.

Referring to FIG. 6, a semiconductor substrate 200 is provided. A dummy gate structure 210 may be formed on the surface of the semiconductor substrate 200.

The semiconductor substrate 200 may be made of single crystalline silicon, polycrystalline silicon, and/or amorphous silicon. The semiconductor substrate 200 may also be made of any other semiconductor material such as Ge, SiGe, GaAs, etc. In addition, the semiconductor substrate 200 may be a bulk material or may have a composite structure such as silicon on insulator, etc. In one embodiment, the semiconductor substrate 200 is made of silicon.

The dummy gate structure 210 may further include a dummy dielectric layer 211 formed on the surface of the semiconductor substrate 200 and a dummy gate electrode layer 212 formed on the top of the dummy dielectric layer 211.

In one embodiment, the dummy dielectric layer 211 is a high-k dielectric layer while the dummy gate electrode layer 212 is a polycrystalline silicon layer. In a subsequent process, the dummy gate electrode layer 212 may be removed to form a trench; then the trench may be filled by a metal gate electrode layer. The metal gate electrode layer together with the high-k dielectric layer (i.e., the dummy dielectric layer 211) may then form a metal gate structure.

In another embodiment, the dummy dielectric layer 211 is made of SiO$_x$ while the dummy gate electrode layer 212 is made of polycrystalline silicon. In a subsequent process, the dummy dielectric layer 211 and the dummy gate electrode layer 212 may be removed to form a trench; then a metal gate structure may be formed by sequentially filling the trench with a high-k dielectric layer and a metal gate electrode layer.

The dummy gate structure 210 may be formed by a method including the following steps. First, a dummy gate dielectric material layer and a dummy gate electrode material layer may be formed on the top of the semiconductor substrate 200 through a deposition process. Then, a patterned mask layer may be formed on the surface of the dummy gate electrode material layer. The patterned mask layer may define the position and the dimension of the dummy gate structure 210. Finally, the dummy gate structure 210 may be formed by etching the dummy gate electrode material layer and the dummy gate dielectric material layer using the patterned mask layer as an etch mask.

The high-k dielectric layer may be made of $HfO_2$, HfSiON, $HfAlO_2$, $HfSiO_4$, ZrO2, $Al_2O_3$, and/or $La_2O_3$. The high-k gate dielectric material layer may also be made of any other dielectric material with a permittivity constant (i.e., dielectric constant) higher than the permittivity constant of $SiO_2$. In one embodiment, the dummy dielectric layer 211 is made of $HfO_2$.

Further, the semiconductor structure may also include sidewalls (not shown) formed on both sides of the dummy gate structure 210. The sidewalls may be used as a mask to protect the dummy gate structure 210 during a subsequent ion implantation process to form a source region and a drain region.

In addition, the semiconductor structure may also include shallow trench isolation structures (not shown) formed in the semiconductor substrate 200. The shallow trench isolation structures may isolate neighboring active regions.

The semiconductor substrate 200 may also be doped with N-type ions in order to adjust the threshold voltage of the PMOS transistor.

Further, returning to FIG. 15, a source region and a drain region may be formed in the semiconductor substrate on the two opposite sides of the dummy gate structure (S202).

Referring to FIG. 6, a pair of source and drain regions 220 are formed in the semiconductor substrate 200 on the two opposite sides of the dummy gate structure 210. That is, the source region 220 and the drain region 220 are separated by the dummy gate structure 210.

In one embodiment, the source and the drain regions 220 are formed by an ion implantation process to implant ions into the semiconductor substrate 200 on the two sides of the dummy gate structure 210 using the dummy gate structure 210 and the sidewalls (not shown) as a mask.

In one embodiment, the implanted ions in the source and the drain regions may be P-type ions such as B, In, etc.

In other embodiments, embedded source and drain regions may be formed. Specifically, the embedded source and drain regions may be formed by a process including the following steps. First, a mask layer may be formed to cover the dummy gate structure and a portion of the semiconductor substrate. The mask layer may expose a portion of the semiconductor substrate on both sides of the dummy gate structure. Then, by etching the semiconductor substrate through an anisotropic dry etching process using the mask layer as an etch mask, two openings may be formed in the semiconductor substrate on the two opposite sides of the dummy gate structure. The two openings may be filled with SiGe. Then, P-type ions may be implanted into SiGe to form embedded source and drain regions. The embedded source and drain regions may induce stress in the channel area of the PMOS transistor, which may further improve the performance of the transistor.

In one embodiment, after forming the source and the drain regions 220, an annealing process may be performed to activate the doped ions and also to eliminate implantation defects.

After the formation of the source and the drain regions 220, a metal silicide layer (221) may also be formed. The metal silicide layer 221 may cover the dummy gate structure 210 as well as the source and the drain regions 220.

The metal silicide may have an electrical conductivity between the electrical conductivity of metal and the electrical conductivity of silicon. Therefore, introducing such a metal silicide layer may reduce contact resistance between the source/drain regions 220 and conductive plugs formed in a subsequent process.

Figure 7:
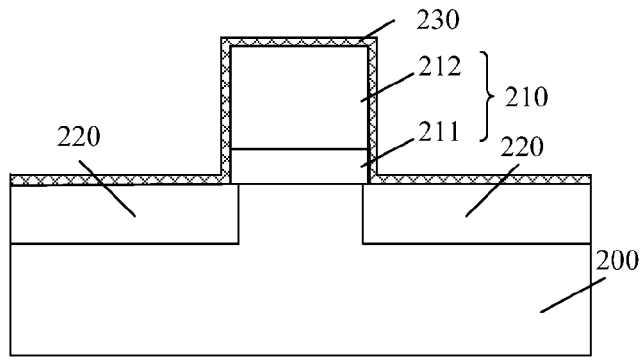

Further, returning to FIG. 15, an intermediate layer may be formed to cover the dummy gate structure and the semiconductor substrate (S203). FIG. 7 shows a schematic cross-section view of the corresponding semiconductor structure.

Referring to FIG. 7, an intermediate layer 230 may be formed. The intermediate layer 230 may cover the dummy gate structure 210 and the semiconductor substrate 200.

In one embodiment, the intermediate layer 230 is made of fluorine-containing SiON. The thickness of the intermediate layer 230 may be in a range of 1 nm to 5 nm.

The intermediate layer 230 may be formed by a deposition process, such as a PCVD process and a low-pressure chemical vapor deposition (LPCVD) process. The formed intermediate layer 230 may cover the dummy gate structure 210 and the surface of the semiconductor substrate 200. In one embodiment, the intermediate layer 230 is formed by a PCVD process.

Specifically, the PCVD deposition process used to form the intermediate layer 230 may be performed by using the following process parameters: a process gas for forming the intermediate layer including $N_2O$, $N_2$, $SiF_4$, and $SiH_4$; a flow rate of $N_2O$ in a range of 9000 sccm to 12000 sccm; a flow rate of $N_2$ in a range of 5000 sccm to 10000 sccm; a flow rate of $SiF_4$ in a range of 800 sccm to 1200 sccm; a flow rate of $SiH_4$ in a range of 800 sccm to 1000 sccm; a pressure in the deposition chamber in a range of 2 torr to 4 torr; an RF power in a range of 1500 W to 2000 W; a deposition temperature in a range of 300° C. to 500° C.; a deposition time in a range of 5 s to 100 s.

Figure 8:
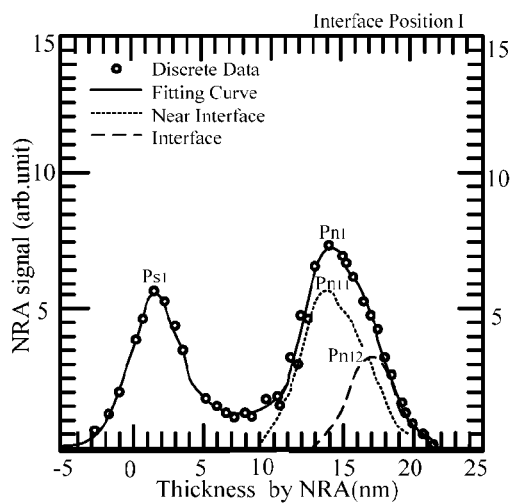

In one embodiment, after forming fluorine-containing SiON by a $N_2O$-containing vapor deposition process, a testing sample, i.e. Sample 1, was selected from the formed structure. A nuclear reaction analysis (NRA) was then performed on Sample 1. FIG. 8 shows the obtained hydrogen absorption profile on the surface and near the surface of Sample 1 by diffusing hydrogen atoms into the structure.

Referring to FIG. 8, the horizontal axis (Thickness by NRA (nm)) represents the depth of the probed cross-section in Sample 1 while the vertical axis (NRA signal (arb. Unit)) represents the hydrogen absorption rate. Further, $P_{s1}$ and $P_{n1}$ represent the hydrogen absorption profiles of Sample 1 at the surface and near the surface, respectively. In order to analyze the hydrogen distribution profile at the interface between the silicon substrate and the high-k dielectric layer (interface position I), the curve $P_{n1}$ may be further decomposed into two curves: a curve $P_{n11}$, reflecting the absorption strength near the interface position I, and another curve $P_{n12}$, reflecting the absorption strength at the interface position I.

In another embodiment, the PCVD process used to form the intermediate layer may be performed by using the following process parameters: a process gas for forming the intermediate layer including NO, $N_2$, $SiF_4$, and $SiH_4$; a flow rate of NO in a range of 9000 sccm to 12000 sccm; a flow rate of $N_2$ in a range of 5000 sccm to 10000 sccm; a flow rate of $SiF_4$ in a range of 800 sccm to 1200 sccm; a flow rate of $SiH_4$ in a range of 800 sccm to 1000 sccm; a pressure in the deposition chamber in a range of 2 torr to 4 torr; an RF power in a range of 1500 W to 2000 W; a deposition temperature in a range of 300° C. to 500° C.; a deposition time in a range of 5 s to 100 s.

Figure 9:
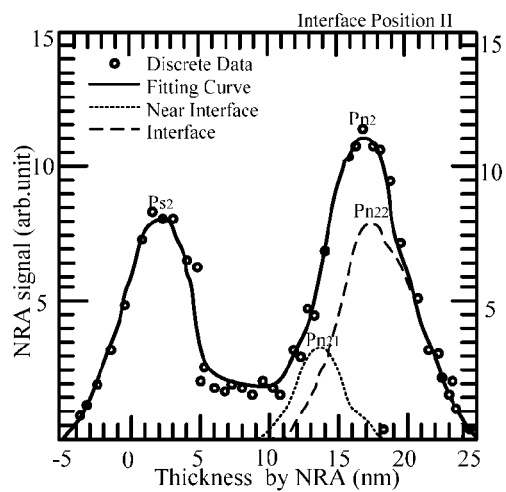

After forming fluorine-containing SiON by a NO-containing vapor deposition process, a testing sample, i.e. Sample 2, was selected from the formed structure. An NRA was then performed on Sample 2. FIG. 9 shows the obtained hydrogen absorption profile on the surface and near the surface of Sample 2 by diffusing hydrogen atoms into the structure.

Referring to FIG. 9, the horizontal axis (Thickness by NRA (nm)) represents the depth of the probed cross-section in Sample 2 while the vertical axis (NRA signal (arb. Unit)) represents the hydrogen absorption rate. Further, $P^{s2}$ and $P_{n2}$ represent the hydrogen absorption profiles of Sample 2 at the surface and near the surface, respectively. In order to analyze the hydrogen distribution profile at the interface between the silicon substrate and the high-k dielectric layer (interface position II), the curve $P_{n2}$ may be further decomposed into two curves: a curve $P_{n21}$, reflecting the absorption strength near the interface position II, and another curve $P_{n22}$, reflecting the absorption strength at the interface position II.

Comparing FIG. 9 to FIG. 8, specifically, comparing $P_{n21}$ and $P_{n22}$ in FIG. 9 to $P_{n11}$ and $P_{n12}$ in FIG. 8, one may draw a conclusion: in Sample I, hydrogen element may be mainly distributed at the interface position I; while in Sample 2, hydrogen element may be mainly distributed near the interface position II. Therefore, SiON formed by using a $N_2O$-containing process gas may have better resistance against hydrogen diffusion than SiON formed by using a NO-containing process gas.

Further, the formed SiON structure may contain fluorine, and fluorine atoms may diffuse into the high-k dielectric layer 211. Therefore, fluorine may further form stable fluoride bonds, such as hafnium-fluorine (Hf—F) bonds and silicon-fluorine (Si—F) bonds, at the interface between the intermediate layer 230 and the high-k dielectric layer 211. Such fluoride bonds may replace unstable silicon-hydrogen (Si—H) bonds. Therefore, forming hydrogen atom through reaction between thermally excited holes and silicon-hydrogen (Si—H) bonds may be avoided and dangling bonds may also be reduced. As such, drift in the threshold voltage may be reduced and the NBTI effect in the PMOS transistor may be suppressed.

Further, returning to FIG. 15, a multiple-level etching stop layer may be formed on the surface of the intermediate layer with each level of the etching stop layer cured individually by ultraviolet (UV) light irradiation (S204). For example, FIG. 10 shows a schematic cross-section view of a semiconductor structure with an etching stop layer 240 having a two-level structure.

Figure 10:
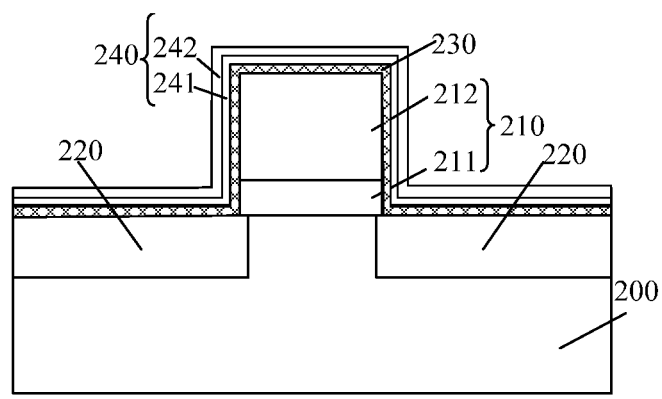

Referring to FIG. 10, the etching stop layer 240 has a two-level structure. The etching stop layer 240 may be formed by a method including the following steps. First, a first etching stop layer 241 may be formed on the surface of the intermediate layer 230. The first etching stop layer 241 may then be cured by UV light. Further, a second etching stop layer 242 may be formed on the first etching stop layer 241. Then, the second etching stop layer 242 may be cured by UV light.

The etching stop layer 240 may be made of $SiN_x$, SiON, SiCN, etc. In one embodiment, the etching stop layer 240 is made of $SiN_x$. The thickness of the etching stop layer 240 may be in a range of 10 nm to 20 nm.

The first etching stop layer 241 and the second etching stop layer 242 may be formed individually by a deposition process such as PCVD, atomic layer deposition (ALD), and LPCVD. In one embodiment, the first etching stop layer 241 and the second etching stop layer 242 are formed separately by a PCVD process. The process parameters used in the PCVD process may include: a deposition gas including $SiH_4$ and $N_2$; a flow rate of $SiH_4$ in a range of 800 sccm to 1000 sccm; a flow rate of $N_2$ in a range of 5000 sccm to 10000 sccm; a pressure in the deposition chamber in a range of 2 torr to 4 torr; an RF power in a range of 1500 W to 2000 W; a deposition temperature in a range of 300° C. to 500° C.; and a deposition time in a range of 5 s to 100 s.

The process parameters used to cure the first etching stop layer 241 and the second etching stop layer 242 using UV light may include: a curing temperature in a range of 300° C. to 400° C.; a wavelength of the UV light source in a range of 250 nm to 400 nm; and a curing time in a range of 1 min to 5 min.

The thickness of the first etching stop layer 241 may or may not equal to the thickness of the second etching stop layer 242. In one embodiment, the first etching stop layer 241 and the second etching stop layer 242 have a same thickness.

During the deposition of the first etching stop layer 241 and the second etching stop layer 242, a large number of reaction molecules, atoms, and ions in either the ground states or the excited states may exist in the gas phase of the deposition vapor, leading to a complex reaction process. The ratio of silicon atoms to nitrogen atoms in the first etching stop layer 241 and the second etching stop layer 242 may vary as the deposition condition changes. Therefore, the ratio of silicon atoms to nitrogen atoms in the etching stop layer may deviate from the normal stoichiometric ratio. Moreover, in addition to having Si—N bonds, the first etching stop layer 241 and the second etching stop layer 242 may also have a large number of Si—H bonds, N—H bonds, and silicon dangling bonds. Thus, the first etching stop layer 241 and the second etching stop layer 242 may contain a lot of hydrogen atoms. In addition, water vapor in the environment may also increase the hydrogen content in the etching stop layer.

Further, hydrogen in the first etching stop layer 241 and the second etching stop layer 242 may diffuse to the interface between silicon and the high-k dielectric layer, leading to formation of more unstable Si—H bonds at the interface. Therefore, the NBTI effect in the PMOS transistor may become more severe.

In one embodiment, because a UV curing process is always performed after forming the first etching stop layer 241 or the second etching stop layer 242, Si—H bonds in the first etching stop layer 241 and the second etching stop layer 242 may be broken during the UV curing process and hydrogen atoms may then be released. As hydrogen atoms in each level of the etching stop layer 240 is effectively released, the probability of forming unstable Si—H bonds at the interface between the silicon substrate and the high-k dielectric layer may be reduced. Therefore, the NBTI effect in the PMOS transistor may also be effectively suppressed.

Alternatively, the etching stop layer may have more than two levels. For example, FIG. 11 shows a schematic cross-section view of a semiconductor structure in another embodiment with an etching stop layer 240 having a three-level structure.

Figure 11:
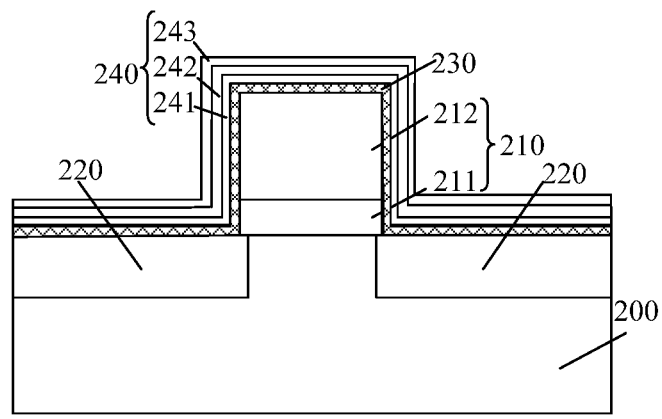

Referring to FIG. 11, the etching stop layer 240 includes a first etching stop layer 241 formed on the intermediate layer 230, a second etching stop layer 242 formed on the first etching stop layer 241, and a third etching stop layer 243 formed on the second etching stop layer 242.

The etching stop layer 240 may be formed by a method including the following steps. First, a first etching stop layer 241 may be formed on the surface of the intermediate layer 230. The first etching stop layer 241 may then be cured by UV light. Further, a second etching stop layer 242 may be formed on the first etching stop layer 241. Then, the second etching stop layer 242 may be cured by UV light. Moreover, a third etching stop layer 243 may be formed on the second etching stop layer 242. Finally, the third etching stop layer 243 may be cured by UV light.

The etching stop layer 240 may be made of $SiN_x$, SiON, SiCN, etc. In one embodiment, the etching stop layer 240 is made of $SiN_x$. The thickness of the etching stop layer 240 may be in a range of 10 nm to 20 nm.

The first etching stop layer 241, the second etching stop layer 242, and the third etching stop layer 243 may be formed individually by a deposition process such as PCVD, ALD, and LPCVD. In one embodiment, the first etching stop layer 241, the second etching stop layer 242, and the third etching stop layer 243 are formed separately by a PCVD process. The process parameters used in the PCVD process may include: a deposition gas including $SiH_4$ and $N_2$; a flow rate of $SiH_4$ in a range of 800 sccm to 1000 sccm; a flow rate of $N_2$ in a range of 5000 sccm to 10000 sccm; a pressure in the deposition chamber in a range of 2 torr to 4 torr; an RF power in a range of 1500 W to 2000 W; a deposition temperature in a range of 300° C. to 500° C.; and a deposition time in a range of 3 s to 70 s.

The process parameter used to cure the first etching stop layer 241, the second etching stop layer 242, and the third etching stop layer 243 by UV light may include: a curing temperature in a range of 300° C. to 400° C.; a wavelength of the UV light source in a range of 250 nm to 400 nm; and a curing time in a range of 0.6 min to 3.5 min.

The thicknesses of the first etching stop layer 241, the second etching stop layer 242, and the third etching stop layer 243 may or may not equal to each other. In one embodiment, the first etching stop layer 241, the second etching stop layer 242, and the third etching stop layer 243 have a same thickness.

During the deposition of the first etching stop layer 241, the second etching stop layer 242, and the third etching stop layer 243, a large number of reaction molecules, atoms, and ions in either the ground states or the excited states may exist in the gas phase of the deposition vapor, leading to a complex reaction process. The ratio of silicon atoms to nitrogen atoms in the first etching stop layer 241, the second etching stop layer 242, and the third etching stop layer 243 may vary as the deposition condition changes. Therefore, the ratio of silicon atoms to nitrogen atoms in the etching stop layer may deviate from the normal stoichiometric ratio. Moreover, besides Si—N bonds, the first etching stop layer 241, the second etching stop layer 242, and the third etching stop layer 243 may also have a large number of Si—H bonds, N—H bonds, and silicon dangling bonds. Thus, the first etching stop layer 241, the second etching stop layer 242, and the third etching stop layer 243 may contain a lot of hydrogen atoms. In addition, water vapor in the environment may also increase the hydrogen content in the etching stop layer.

Further, hydrogen in the first etching stop layer 241, the second etching stop layer 242, and the third etching stop layer 243 may diffuse to the interface between silicon and the high-k dielectric layer, leading to formation of more unstable Si—H bonds at the interface. Therefore, the NBTI effect in the PMOS transistor may become more severe.

In one embodiment, because a UV curing process is always performed after forming each of the first etching stop layer 241, the second etching stop layer 242, and the third etching stop layer 243, Si—H bonds in the first etching stop layer 241, the second etching stop layer 242, and the third etching stop layer 243 may be broken during the UV curing process and hydrogen atoms may then be released. As hydrogen atoms in each level of the etching stop layer 240 is effectively released, the probability of forming unstable Si—H bonds at the interface between the silicon substrate and the high-k dielectric layer may be reduced. Therefore, the NBTI effect in the PMOS transistor may also be effectively suppressed.

Further, reducing hydrogen content in the etching stop layer by decreasing the thickness of the etching stop layer may not result in desired improvement because decreasing the thickness of the etching stop layer may also reduce the stress induced in the channel area by the etching stop layer, which may further affect the performance of the PMOS transistor.

When the thickness of the etching stop layer is in a certain range and the etching stop layer does not contain multiple levels, the curing time and the curing temperature of the UV curing process performed on the etching stop layer may approach the upper limits for UV curing. Specifically, increasing the UV curing time and the UV curing temperature may result in severe distortion of the surface of the etching stop layer. Therefore, to improve the hydrogen released degree in the etching stop layer by simply increasing the UV curing time and the UV curing temperature without adopting the multiple-level structure described above may not be able to improve the performance of the PMOS transistor.

In one embodiment, because the etching stop layer 240 has a multiple-level structure and a UV curing process is always performed after the formation of each level of the etching stop layer, the hydrogen released degree in the etching stop layer 240 may be effectively improved; in the meantime, severe distortion of the surface of the etching stop layer 240 may also be avoided.

In certain other embodiments, the number of levels of the multiple-level etching stop layer 240 may be determined based on actual demands. With more levels, more hydrogen element in the semiconductor structure may be released during the subsequent curing processes, thus the formed etching stop layer 240 may contain less hydrogen, which is conducive to suppressing the NBTI effect in the PMOS transistor. However, when the number of the multiple-level etching stop layer 240 is too large, a more complex fabrication process may be required and the product cost may also increase. Therefore, to balance between productivity and product performance, the number of levels of the multiple-level etching stop layer 240 may range from 2 to 4.

Figure 12:
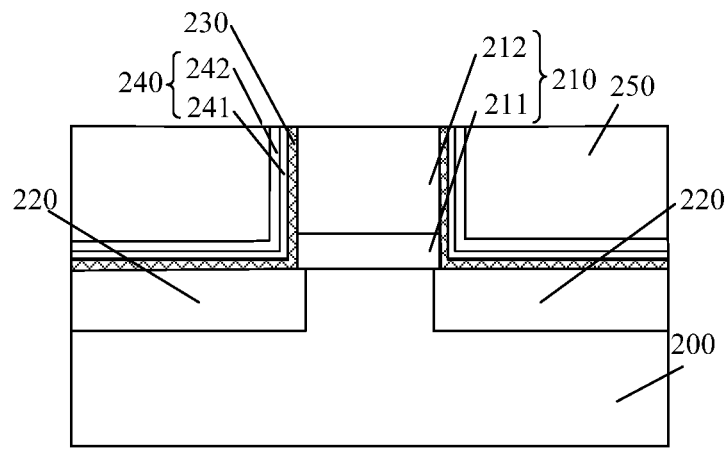

Further, returning to FIG. 15, an interlayer dielectric layer may be formed on the semiconductor substrate on both sides of the dummy gate structure (S205). FIG. 12 shows a schematic cross section view of the corresponding semiconductor structure having an interlayer dielectric layer 250 formed on both sides of the dummy gate structure 210.

Referring to FIG. 12, the interlayer dielectric layer 250 may be formed by a process including the following steps. First, an interlayer dielectric material layer may be formed on the semiconductor substrate 200 and the dummy gate structure 210. Then, an interlayer dielectric layer 250 may be formed by performing a planarization process on the interlayer dielectric material layer until the top surface of the dummy gate structure 210 is exposed.

The interlayer dielectric layer 250 may be made of $SiO_x$, SiON, $SiN_x$, etc. In one embodiment, the interlayer dielectric layer 250 is made of $SiO_x$.

Figure 13:
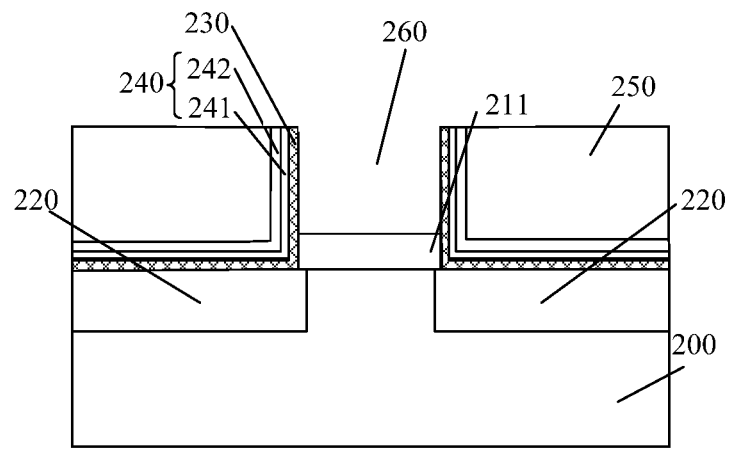

Further, returning to FIG. 15, a trench may be formed by removing the polycrystalline silicon layer in the dummy gate structure (S206). FIG. 13 shows a schematic cross-section view of the corresponding semiconductor structure.

Referring to FIG. 13, the polycrystalline silicon layer 212 (referring to FIG. 12) in the dummy gate structure (referring to FIG. 12) is removed and a trench 260 is then formed.

The polycrystalline silicon layer 212 may be removed by a wet etching or a dry etching process.

In one embodiment, the polycrystalline silicon layer 212 is removed by a dry etching process. The etching gas may include HBr as a primary etching gas. In addition, the etching gas may also include a supplemental gas, such as $O_2$ and Ar, to improve the performance of the etching process.

Figure 14:
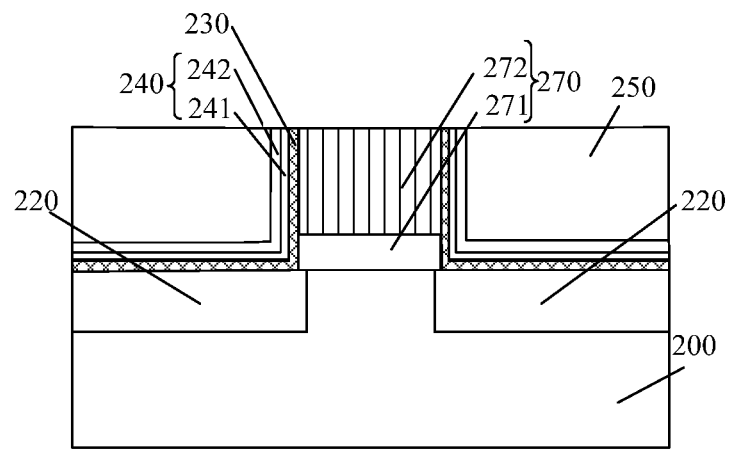

Further, returning to FIG. 15, a metal gate structure may be completed by filling the trench with a metal gate electrode (S207). FIG. 14 shows a schematic cross-section view of the corresponding semiconductor structure.

Referring to FIG. 14, the trench 260 (referring to FIG. 13) is filled with a metal gate electrode 272. A complete metal gate structure 270 is then formed.

The metal gate electrode 272 may be formed by depositing multiple films. The multiple stacked films may include a work function layer and a metal gate electrode layer.

The work function layer may be made of Ti, Ta, TiN, TaN, TiAl, TaSiN, TiSiN, TiAlN, or TaAlN. The work function layer may be used to adjust the work function of the PMOS transistor and reduce the threshold voltage of the PMOS transistor, thus reduce the power consumption. The work function layer may be formed by a chemical vapor deposition (CVD) process or a physical vapor deposition (PVD) process.

The gate electrode layer may be made of Al, Cu, Ag, Au, Pt, Ni, Ti, TiN, TaN, Ta, TaC, TaSiN, W, WN, or WSi. The gate electrode layer may be formed by a PVD process or a CVD process. The gate electrode layer may be formed on the top of the work function layer.

The metal gate structure 270 may include a high-k dielectric layer 271 formed on the top of the semiconductor substrate 200 and the metal gate electrode 272 formed on the top of the high-k dielectric layer 271.

In one embodiment, the high-k dielectric layer 271 in the metal gate structure 270 is the same as the dummy dielectric layer 211 in the dummy gate structure 210 (referring to FIG. 12). In other embodiments, the metal gate structure 270 may also be formed by completely removing the dummy gate structure 210, including both the dummy gate electrode 212 and the dummy dielectric layer 211, and then forming a high-k dielectric layer 271 and a metal gate electrode 272. As such, the newly-formed high-k dielectric layer 271 and metal gate electrode 272 together form the metal gate structure 270.

The present disclosure also provides a PMOS transistor. FIG. 14 shows a schematic cross-section view of an exemplary PMOS transistor consistent with disclosed embodiments.

Referring to FIG. 14, the PMOS transistor may include a semiconductor substrate 200, a metal gate structure 270 formed on the surface of the semiconductor substrate 200, a source region 220 and a drain region 220 formed in the semiconductor substrate 200 on the two opposite sides of the metal gate structure 270, an intermediate layer 230 covering the sidewall surfaces of the metal gate structure 270 and the surface of the semiconductor substrate 200, and a multiple-level etching stop layer 240 formed on the surface of the intermediate layer 230.

The metal gate structure 270 may further include a high-k dielectric layer 271 formed on the semiconductor substrate 200 and a metal gate electrode 272 formed on the high-k dielectric layer 271.

The intermediate layer is made of fluorine-containing SiON.

The PMOS transistor provided in the present closure may not only have an intermediate layer covering the sidewall surfaces of the metal gate structure and the surface of the semiconductor substrate but also have a multiple-level etching stop layer formed on the surface of the intermediate layer. The intermediate layer may prevent hydrogen in the etching stop layer from diffusing into the interface between the semiconductor substrate and the high-k dielectric layer, and thus prevent the formation of unstable Si—H bonds at the interface. In addition, the hydrogen content in the etching stop layer may be relatively small, thus the probability of hydrogen diffusing into the interface between the semiconductor substrate and the high-k dielectric layer may also be very small. In addition, according to the disclosed method and the disclosed PMOS transistor, the surface of the etching stop layer may not be severely deformed. As unstable Si—H bonds formed at the interface between the semiconductor substrate and the high-k dielectric layer in the PMOS transistor become less, the NBTI effect in the PMOS transistor may be suppressed.

Compared to existing PMOS transistors and existing fabrication methods, the PMOS transistor and the fabrication method in the present disclosure may demonstrate several advantages.

First, according to the present disclosure, the fabrication method for the PMOS transistor may include forming an intermediate layer to cover the dummy gate structure and the semiconductor substrate. The intermediate layer may prevent hydrogen in the etching stop layer from diffusing into the interface between the semiconductor substrate and the high-k dielectric layer, and thus prevent the formation of unstable Si—H bonds at the interface so that the NBTI effect in the PMOS transistor may be suppressed.

Further, the disclosed fabrication method for the PMOS transistor may also include forming a multiple-level etching stop layer on the surface of the intermediate layer and performing a UV curing process after forming each level of the etching stop layer. Performing a UV curing process on the etching stop layer may break the Si—H bonds in the etching stop layer and may release hydrogen atoms, thus the hydrogen content in the etching stop layer may be reduced. Moreover, the etching stop layer may have a multiple-level structure and after forming each level of the etching stop layer, a UV curing process may be performed. As such, the hydrogen released degree in the formed etching stop layer may be improved; in the meantime, the surface of the etching stop layer may not be severely deformed. Therefore, the probability of forming unstable Si—H bonds at the interface between the silicon substrate and the high-k dielectric layer may be reduced and the NBTI effect in the PMOS transistor may also be effectively suppressed.

Moreover, the intermediate layer may be made of fluorine-containing SiON. SiON formed by a process using $N_2O$ as a precursor gas has relatively strong resistance against hydrogen diffusion. In addition, fluorine atoms in the intermediate layer may enter the high-k dielectric layer through diffusion. Fluorine may further form stable fluoride bonds such as hafnium-fluorine (Hf—F) bonds and silicon-fluorine (Si—F) bonds at the interface between the intermediate layer and the high-k dielectric layer to replace unstable silicon-hydrogen (Si—H) bonds. Therefore, forming hydrogen atom through reaction between thermally excited holes and silicon-hydrogen (Si—H) bonds may be avoided and dangling bonds may also be reduced. As such, drift in the threshold voltage may be reduced and the NBTI effect in the PMOS transistor may also be suppressed.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a p-channel metal-oxide-semiconductor (PMOS) transistor, comprising:
    forming a dummy gate structure on a semiconductor substrate;
    forming a source region and a drain region in the semiconductor substrate on both sides of the dummy gate structure;
    forming an intermediate layer to cover the dummy gate structure and the semiconductor substrate; and
    forming a multiple-level etching stop layer including at least a first etching stop layer and a second etching stop layer and performing a UV curing process after forming each of the first and second etching stop layers,
    wherein the intermediate layer is formed by a plasma-enhanced chemical vapor deposition process using a process gas containing NCO, N2 SiF, and $SiH_4$,
    wherein the intermediate layer is formed by the plasma-enhanced chemical vapor deposition process using process parameters including:
    a flow rate of N20 in a range of 9000 sccm to 12000 sccm;
    a flow rate of N2 in a range of 5000 sccm to 10000 sccm;
    a flow rate of SiF4 in a range of 800 sccm to 1200 sccm;
    a flow rate of SiH4 in a range of 800 sccm to 1000 sccm;
    a pressure in the deposition chamber in a range of 2 torr to 4 torr;
    an RF power in a range of 1500 W to 2000 W;
    a deposition temperature in a range of 300° C. to 500° C.; and
    a deposition time in a range of 5 s to 100 s.

2. The method for fabricating the PMOS transistor according to claim 1, wherein the intermediate layer is made of fluorine-containing SiON.

3. The method for fabricating the PMOS transistor according to claim 1, wherein a thickness of the intermediate layer is in a range of 1 nm to 5 nm.

4. The method for fabricating the PMOS transistor according to claim 1, wherein a total thickness of the multiple-level etching stop layer is in a range of 10 nm to 20 nm.

5. The method for fabricating the PMOS transistor according to claim 1, wherein all the levels in the multiple-level etching stop layer have a same thickness.

6. The method for fabricating the PMOS transistor according to claim 1, wherein the multiple-level etching stop layer has a number of levels in a range of 2 to 4.

7. The method for fabricating the PMOS transistor according to claim 1, wherein the multiple-level etching stop layer is formed by a process including:
    forming the first etching stop layer on the intermediate layer;
    UV curing the first etching stop layer using UV light;
    forming the second etching stop layer on the first etching stop layer after the UV curing; and
    UV curing the second etching stop layer using UV light.

8. The method for fabricating the PMOS transistor according to claim 1, wherein each of the first etching stop layer and the second etching stop layer is made of $SiN_x$, SiON, SiCN, or a combination thereof.

9. The method for fabricating the PMOS transistor according to claim 1, wherein each of the first etching stop layer and the second etching stop layer is formed by a plasma-enhanced chemical vapor deposition processes using:
    a deposition gas including $SiH_4$ and $N_2$;
    a flow rate of $SiH_4$ in a range of 800 sccm to 1000 sccm;
    a flow rate of $N_2$ in a range of 5000 sccm to 10000 sccm;
    a pressure in the deposition chamber in a range of 2 torr to 4 torr;
    an RF power in a range of 1500 W to 2000 W;
    a deposition temperature in a range of 300° C. to 500° C.; and
    a deposition time in a range of 5 s to 100 s.

10. The method for fabricating the PMOS transistor according to claim 1, wherein the UV curing process performed after forming each of the first etching stop layer and the second etching stop layer further includes:
    a curing temperature in a range of 300° C. to 400° C.;
    a wavelength of UV light in a range of 250 nm to 400 nm; and
    a curing time in a range of 1 min to 5 min.

11. The method for fabricating the PMOS transistor according to claim 1, wherein the multiple-level etching stop layer further includes:
    a third etching stop layer formed on the second etching stop layer.

12. The method for fabricating the PMOS transistor according to claim 11, wherein the multiple-level etching stop layer is formed by a process including:
    forming the first etching stop layer on the intermediate layer;
    UV curing the first etching stop layer using UV light;
    forming the second etching stop layer on the first etching stop layer after the UV curing;
    UV curing the second etching stop layer using UV light;
    forming the third etching stop layer on the second etching stop layer after the UV curing; and
    UV curing the third etching stop layer using UV light.

13. The method for fabricating the PMOS transistor according to claim 12, wherein each of the first etching stop layer, the second etching stop layer, and the third etching stop layer is made of $SiN_x$, SiON, SiCN, or a combination thereof.

14. The method for fabricating the PMOS transistor according to claim 13, wherein each of the first etching stop layer, the second etching stop layer, and the third etching stop layer is formed by a plasma-enhanced chemical vapor deposition process using:
- a deposition gas including $SiH_4$ and $N_2$;
- a flow rate of $SiH_4$ in a range of 800 sccm to 1000 sccm;
- a flow rate of $N_2$ in a range of 5000 sccm to 10000 sccm;
- a pressure in the deposition chamber in a range of 2 torr to 4 torr;
- an RF power in a range of 1500 W to 2000 W;
- a deposition temperature in a range of 300° C. to 500° C.; and
- a deposition time in a range of 3 s to 70 s.

15. The method for fabricating the PMOS transistor according to claim 12, wherein the UV curing process, performed after forming each of the first etching stop layer, the second etching stop layer, and the third etching stop layer, includes:
- a curing temperature in a range of 300° C. to 400° C.;
- a wavelength of the UV light in a range of 250 nm to 400 nm; and
- a curing time in a range of 0.6 min to 3.5 min.

16. The method for fabricating the PMOS transistor according to claim 1, after forming the source region and the drain region, further including:
- forming a metal silicide layer to cover the dummy gate structure, the source region, and the drain region.

17. The method for fabricating the PMOS transistor according to claim 1, wherein:
- the dummy gate structure further includes a high-k dielectric layer formed on the semiconductor substrate and a polycrystalline silicon layer formed on the high-k dielectric layer;
- after forming the multiple-level etching stop layer on the intermediate layer, an interlayer dielectric layer is formed to cover the semiconductor substrate on both sides of the dummy gate structure;
- a trench is formed by removing the polycrystalline silicon layer in the dummy gate structure; and
- a metal gate electrode is formed to fill the trench, wherein the high-k dielectric layer formed on the semiconductor substrate and the metal gate electrode together form a metal gate structure.

* * * * *